(12) United States Patent
Ghyselen

(10) Patent No.: US 12,426,507 B2
(45) Date of Patent: *Sep. 23, 2025

(54) METHOD FOR PRODUCING A CRYSTALLINE LAYER OF PZT MATERIAL BY TRANSFERRING A SEED LAYER OF SRTIO3 TO A SILICON CARRIER SUBSTRATE AND EPITAXIALLY GROWING THE CRYSTALLINE LAYER OF PZT, AND SUBSTRATE FOR EPITAXIAL GROWTH OF A CRYSTALLINE LAYER OF PZT

(71) Applicant: Soitec, Bernin (FR)

(72) Inventor: Bruno Ghyselen, Seyssinet (FR)

(73) Assignee: Soitec (FR)

( * ) Notice: Subject to any disclaimer, the term of this patent is extended or adjusted under 35 U.S.C. 154(b) by 14 days.

This patent is subject to a terminal disclaimer.

(21) Appl. No.: 18/464,918

(22) Filed: Sep. 11, 2023

(65) Prior Publication Data

US 2023/0422619 A1    Dec. 28, 2023

Related U.S. Application Data

(63) Continuation of application No. 17/042,657, filed as application No. PCT/IB2019/000201 on Mar. 26, 2019, now Pat. No. 11,877,514.

(30) Foreign Application Priority Data

Mar. 28, 2018  (FR) ...................................... 1800253

(51) Int. Cl.
   *H10N 30/079*  (2023.01)
   *C30B 23/02*  (2006.01)
   (Continued)

(52) U.S. Cl.
   CPC ......... *H10N 30/079* (2023.02); *C30B 25/183* (2013.01); *C30B 29/22* (2013.01);
   (Continued)

(58) Field of Classification Search
   CPC .... H10N 30/079; H10N 30/85; H10N 30/853; H10N 30/8554; H10N 30/8548;
   (Continued)

(56) References Cited

U.S. PATENT DOCUMENTS 5,442,585 A * 8/1995 Eguchi ................. H10N 30/076
                                                257/E21.651
6,593,212 B1   7/2003 Kub et al.
(Continued)

FOREIGN PATENT DOCUMENTS

JP    05-234419 A    9/1993
JP    2003-309299 A  10/2003
(Continued)

OTHER PUBLICATIONS

Chinese 2nd Office Action for Application No. 201980021417.7 dated Jul. 22, 2022, 6 pages.
(Continued)

*Primary Examiner* — Matthew E. Hoban
*Assistant Examiner* — Lynne Edmondson
(74) *Attorney, Agent, or Firm* — TraskBritt

(57) ABSTRACT

A process for producing a crystalline layer of PZT material, comprising the transfer of a monocrystalline seed layer of SrTiO3 material to a carrier substrate of silicon material, followed by epitaxial growth of the crystalline layer of PZT material.

19 Claims, 5 Drawing Sheets

(51) Int. Cl.
  *C30B 25/18* (2006.01)
  *C30B 29/22* (2006.01)
  *C30B 33/06* (2006.01)
  *H10N 30/00* (2023.01)
  *H10N 30/853* (2023.01)

(52) U.S. Cl.
  CPC .......... *C30B 33/06* (2013.01); *H10N 30/708* (2024.05); *H10N 30/8554* (2023.02)

(58) Field of Classification Search
  CPC ...... H10N 25/183; C30B 29/22; C30B 33/06; C30B 23/025; C30B 25/183; H01L 21/76254; H01L 21/76224
  See application file for complete search history.

(56) References Cited

U.S. PATENT DOCUMENTS

| | | | |
|---|---|---|---|
| 6,867,067 | B2 | 3/2005 | Ghyselen et al. |
| 7,646,038 | B2 | 1/2010 | Faure et al. |
| 11,877,514 | B2* | 1/2024 | Ghyselen ............. H10N 30/708 |
| 2003/0143853 | A1* | 7/2003 | Celii ..................... H10D 1/682 257/E21.664 |
| 2004/0023468 | A1 | 2/2004 | Ghyselen et al. |
| 2005/0213282 | A1* | 9/2005 | Kondo ................. H10N 30/079 257/E29.164 |
| 2006/0035440 | A1 | 2/2006 | Ghyselen et al. |
| 2006/0216907 | A1 | 9/2006 | Cayrefourcq et al. |
| 2006/0288928 | A1* | 12/2006 | Eom .................. H10N 30/8548 117/89 |
| 2011/0171812 | A1 | 7/2011 | Letertre et al. |
| 2013/0119401 | A1 | 5/2013 | D'Evelyn et al. |
| 2015/0014853 | A1 | 1/2015 | Brenner et al. |
| 2015/0041853 | A1 | 2/2015 | Cheng et al. |
| 2021/0020434 | A1 | 1/2021 | Ghyselen |

FOREIGN PATENT DOCUMENTS

| | | |
|---|---|---|
| JP | 2008-532328 A | 8/2008 |
| JP | 2012-001432 A | 1/2012 |
| JP | 2018-046512 A | 3/2018 |
| WO | 2004/079059 A1 | 9/2004 |
| WO | 2006/135662 A2 | 12/2006 |
| WO | 2016/203955 A1 | 12/2016 |
| WO | 2017/046548 A1 | 3/2017 |

OTHER PUBLICATIONS

Chinese Decision of Rejection for Application No. 201980021417.7 dated Oct. 17, 2022, 5 pages.
Chinese Search Report for Application No. 201980021417.7 dated Feb. 16, 2022, 12 pages.
French Office Action for French Application No. FR1800253, dated Jan. 29, 2019, 14 pages with translation.
International Search Report for International Application No. PCT/IB2019/000201 dated Jun. 4, 2019, 2 pages.
International Written Opinion for International Application No. PCT/IB2019/000201 dated Jun. 4, 2019, 5 pages.
Japanese Notice of Reasons for Rejections for Application No. 2020-549791 dated Feb. 20, 2023, 5 pages.
Japanese Office Action for Application No., 2020-549791 dated Aug. 22, 2023, 3 pages.
Singapore Written Opinion for Application No. 11202009530V dated May 16, 2022, 8 pages.
Singapore Written Opinion for Singapore Application No. 11202009530V dated Sep. 28, 2021, 10 pages.
Thevuthasan et al., Cleaving Oxide Films Using Hydrogen Implantation, Matials Letters, vol. 49, Issue 6, Jul. 2001, pp. 313-317, (abstract only).
Yin et al., Epitaxial growth and electrical measurement of single crystalline Pb(ZrO.52TiO.48)03 thin film on Si(001) for microelectromechanical systems, Thin Solid Films, vol. 520, Issue 14, May 1, 2012, pp. 4572-4575, (abstract only).
Penanen et al., 4He liquid-vapor interface below 1 K studied using x-ray reflectivity, Physical Review B, vol. 62, No. 14, (Oct. 1, 2000), pp. 9621-9640.
European Communication pursuant to Article 94(3) EPC for European U.S. Appl. No. 19/722,177, dated Mar. 19, 2024, 5 pages.
Japanese Decision to Grant a Patent for Japanese Application No. 2020-549791, dated Feb. 6, 2024, 6 pages with English translation.
Korean Office Action for Application No. 10-2020-7030290 dated Aug. 25, 2023, 5 pages.
Korean Written Decision on Registration received for Korean Patent Application No. 10-2020-7030290, mailed on Jan. 23, 2024, 5 pages With English Translations.

\* cited by examiner

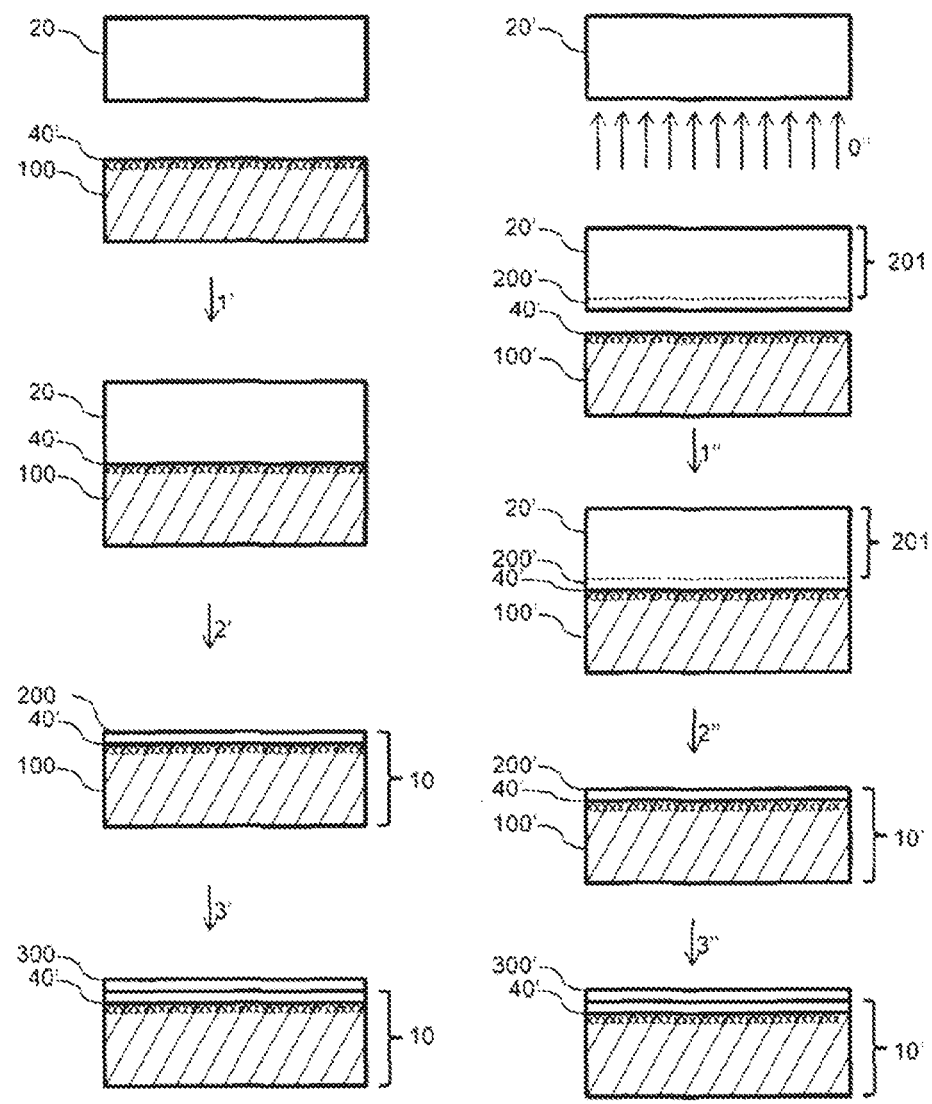

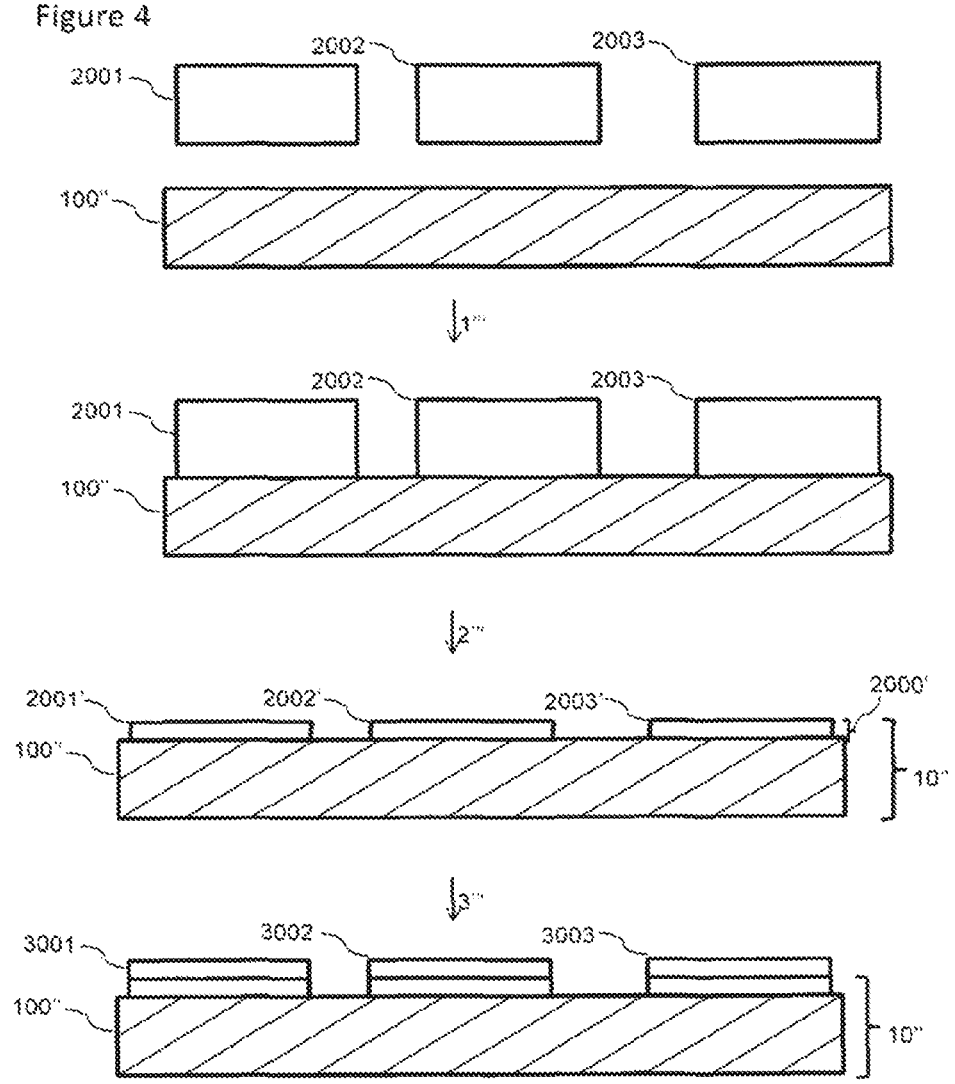

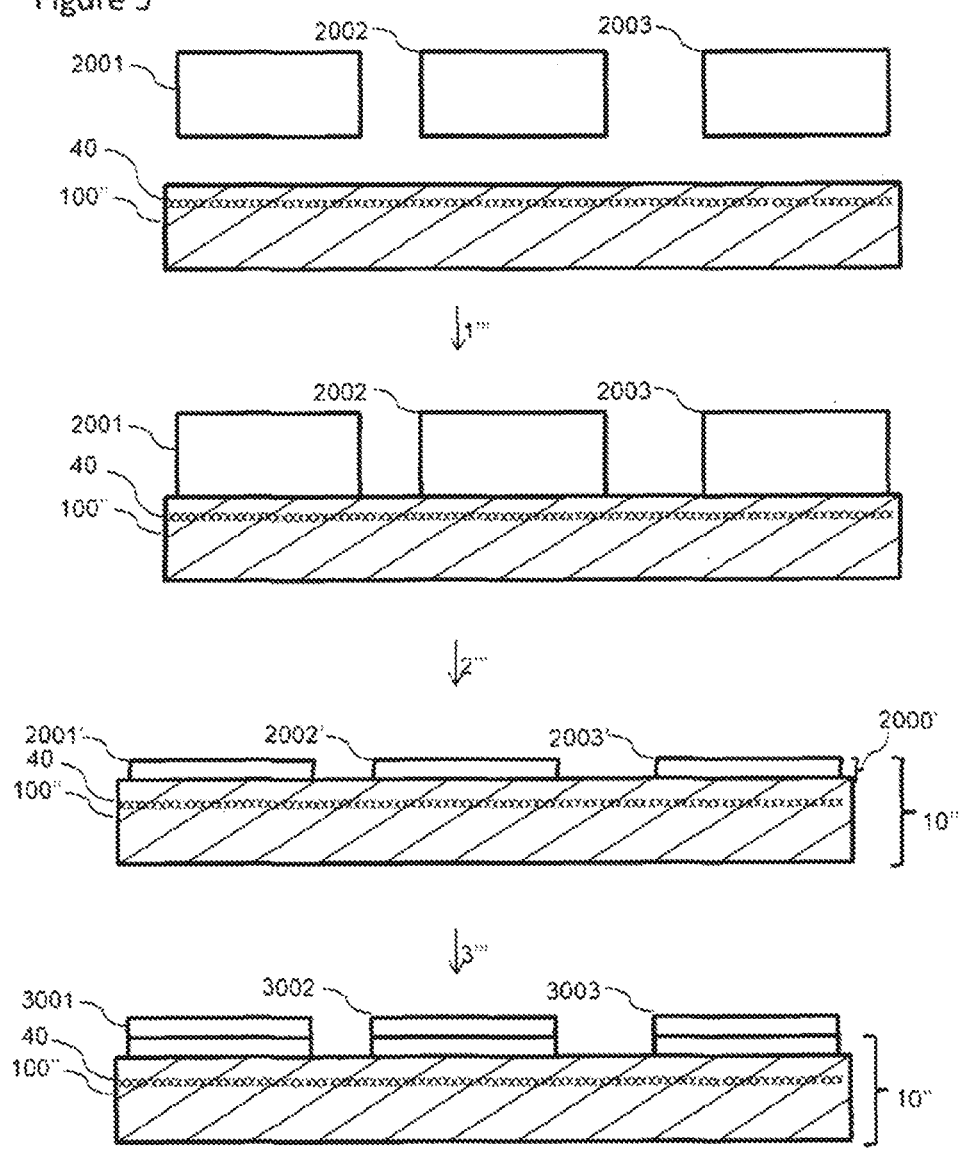

METHOD FOR PRODUCING A CRYSTALLINE LAYER OF PZT MATERIAL BY TRANSFERRING A SEED LAYER OF SRTIO3 TO A SILICON CARRIER SUBSTRATE AND EPITAXIALLY GROWING THE CRYSTALLINE LAYER OF PZT, AND SUBSTRATE FOR EPITAXIAL GROWTH OF A CRYSTALLINE LAYER OF PZT

CROSS-REFERENCE TO RELATED APPLICATIONS

This application is a continuation of U.S. Patent Application Ser. No. 17/042,657, filed Sep. 28, 2020, now U.S. Pat. No. 11,877,514 issued January 16 2024, which is a national phase entry under 35 U.S.C. § 371 of International Patent Application PCT/IB2019/000201, filed Mar. 26, 2019, designating the United States of America and published as International Patent Publication WO 2019/186264 A1 on Oct. 3, 2019, which claims the benefit under Article 8 of the Patent Cooperation Treaty to French Patent Application Serial No. 1800253, filed Mar. 28, 2018, the disclosure of each of which is hereby incorporated herein in its entirety by this reference.

TECHNICAL FIELD

The present disclosure relates to a process for producing a crystalline layer of lead zirconate titanate (PZT) material and a substrate for the epitaxial growth of such a crystalline layer of PZT material.

BACKGROUND

Certain materials are not currently available as a crystalline substrate let alone as a monocrystalline substrate in the form of a large-diameter wafer. Moreover, certain materials may be available in large diameter but not with certain characteristics or specifications in terms of quality, in particular, with regard to the density of defects or the required electrical or optical properties.

BRIEF SUMMARY

The present disclosure aims to overcome these limitations of the prior art by providing a process for producing a crystalline layer of PZT material, preferably a monocrystalline layer of PZT, and a substrate for the epitaxial growth of such a crystalline layer of PZT material, preferably of such a monocrystalline layer of PZT material. In this way it is possible to address the problem of size of the crystalline or even monocrystalline substrates of PZT material currently available.

The present disclosure relates to a process for producing a crystalline layer of PZT material comprising the transfer of a monocrystalline seed layer of $SrTiO_3$ material to a carrier substrate of silicon material followed by epitaxial growth of the crystalline layer of PZT material.

In advantageous embodiments, the crystalline layer of PZT material is monocrystalline.

In advantageous embodiments, the monocrystalline seed layer has a thickness of less than 10 µm, preferably less than 2 µm, and more preferably less than 0.2 µm.

In advantageous embodiments, the transfer of the monocrystalline seed layer of $SrTiO_3$ material to the carrier substrate of silicon material comprises a step of joining a monocrystalline substrate of $SrTiO_3$ material to the carrier substrate followed by a step of thinning of the monocrystalline substrate of $SrTiO_3$ material.

In advantageous embodiments, the thinning step comprises the formation of a weakened zone delimiting a portion of the monocrystalline substrate of $SrTiO_3$ material intended to be transferred to the carrier substrate of silicon material.

In advantageous embodiments, the formation of the weakened zone is obtained by implanting atomic and/or ionic species.

In advantageous embodiments, the thinning step comprises detaching at the weakened zone so as to transfer the portion of the monocrystalline substrate of $SrTiO_3$ material to the carrier substrate of silicon material, in particular, the detaching comprises the application of thermal and/or mechanical stress.

In advantageous embodiments, the joining step is a molecular adhesion step.

In advantageous embodiments, the monocrystalline seed layer of $SrTiO_3$ material is in the form of a plurality of tiles each transferred to the carrier substrate of silicon material.

In advantageous embodiments, the carrier substrate of silicon material comprises a detachable interface configured to be detached by means of a laser debonding technique and/or chemical attack and/or by means of mechanical stress.

The present disclosure also relates to a substrate for epitaxial growth of a crystalline layer of PZT material, wherein the substrate comprises a monocrystalline seed layer of $SrTiO_3$ material on a carrier substrate of silicon material.

In advantageous embodiments, the crystalline layer of PZT material is monocrystalline.

In advantageous embodiments, the monocrystalline seed layer of $SrTiO_3$ material is in the form of a plurality of tiles.

In advantageous embodiments, the carrier substrate of silicon material comprises a detachable interface configured to be detached by means of a laser debonding technique and/or chemical attack and/or by means of mechanical stress.

The present disclosure also relates to a process for producing a crystalline layer of material comprising PMN-PT and/or PZN-PT having a lattice parameter close to that of the PZT material comprising the transfer of a monocrystalline seed layer of $SrTiO_3$ material to a carrier substrate of silicon material followed by epitaxial growth of the crystalline layer of PMN-PT or PZN-PT material.

The present disclosure also relates to a process for producing a crystalline layer of material comprising PMN-PT and/or PZN-PT having a lattice parameter close to that of the PZT material comprising the transfer of a monocrystalline seed layer of YSZ or $CeO_2$ or MgO or $Al_2O_3$ material to a carrier substrate of silicon material followed by epitaxial growth of the crystalline layer of PMN-PT or PZN-PT material.

The present disclosure also relates to a substrate for epitaxial growth of a crystalline layer of material comprising PMN-PT and/or PZN-PT having a lattice parameter close to that of the PZT material, wherein the substrate comprises a monocrystalline seed layer of $SrTiO_3$ or YSZ or $CeO_2$ or MgO or $Al_2O_3$ material on a carrier substrate of silicon, sapphire, Ni or Cu material.

BRIEF DESCRIPTION OF THE DRAWINGS

Other features and advantages of the present disclosure will be better understood from reading the following detailed description with reference to the appended drawings, in which:

FIG. 3 illustrates a process for producing a crystalline layer of PZT material according to yet another embodiment of the present disclosure and a substrate for the epitaxial growth of such a crystalline layer of PZT material according to this other embodiment of the present disclosure;

FIG. 4 illustrates a process for producing a crystalline layer of PZT material according to yet another embodiment of the present disclosure and a substrate for the epitaxial growth of such a crystalline layer of PZT material according to this other embodiment of the present disclosure; and FIG. 5 illustrates a process for producing a crystalline layer of PZT material according to yet another embodiment of the present disclosure and a substrate for the epitaxial growth of such a crystalline layer of PZT material according to this other embodiment of the present disclosure.

To improve the readability of the figures, the various layers are not necessarily shown to scale.

DETAILED DESCRIPTION

Figure 1:
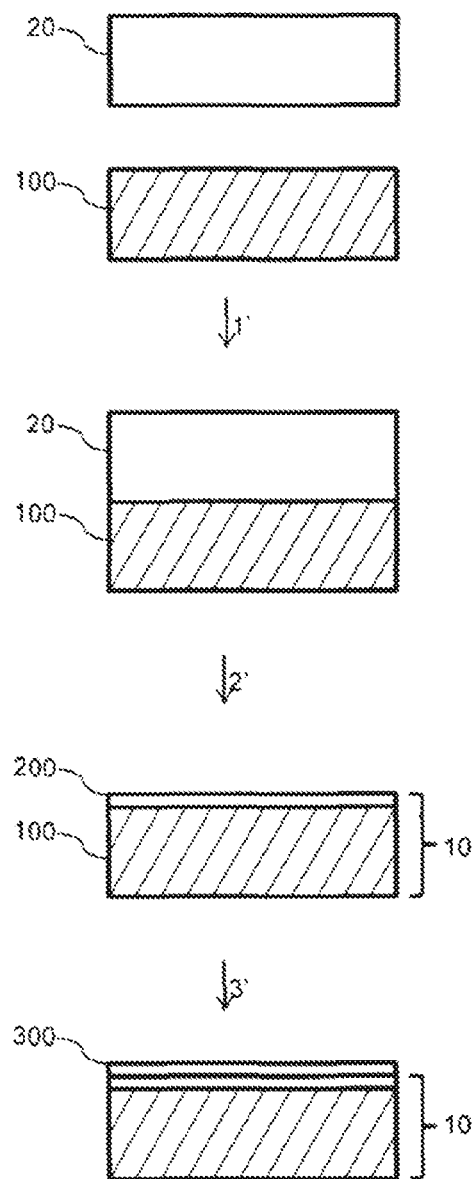
FIG. 1 illustrates a process for producing a crystalline layer of PZT material according to one embodiment of the present disclosure and a substrate for the epitaxial growth of such a crystalline layer of PZT material according to this embodiment of the present disclosure.

FIG. 1 illustrates a carrier substrate 100 of silicon material to which a monocrystalline seed layer 200 of $SrTiO_3$ material is transferred. Other materials for the monocrystalline seed layer 200 may be envisaged such as YSZ, $CeO_2$, MgO or $Al_2O_3$, these having a lattice parameter close to that of the PZT material. The carrier substrate 100 of silicon material may also be replaced with a carrier substrate 100 of sapphire, Ni or Cu material. The use of silicon has the advantage of opening up the field of application of layers of PZT material not only for 300 mm-type large-scale equipment, but also making it compatible with the microelectronics industry, for which the requirements in terms of acceptance on the production line for exotic material other than silicon, especially PZT, are high. The step of joining 1' the monocrystalline seed layer 200 of $SrTiO_3$ material to the carrier substrate 100 of silicon material is preferably carried out by way of a molecular adhesion step. This molecular adhesion step comprises a bonding step, preferably at ambient temperature, and is followed by an anneal for consolidating the bonding interface, which is usually carried out at high temperatures of up to 900° C. or even 1100° C. for a duration of a few minutes to a few hours. Regarding a carrier substrate of sapphire material, the step of joining 1' the monocrystalline seed layer to the carrier substrate is also preferably carried out by way of a molecular adhesion step using typical conditions of the same order of magnitude as mentioned above. Regarding a carrier substrate of Ni or Cu material, the step of joining 1' the monocrystalline seed layer to the carrier substrate is replaced by a step of depositing the Ni or Cu material on the monocrystalline seed layer, for example, via deposition by electrodeposition (ECD) or electroforming (electroplating). This technique usually includes the use of a tie layer and stripping and is known per se and will not be described in more detail here.

FIG. 1 schematically shows the step of joining 1' a monocrystalline substrate 20 of $SrTiO_3$ material to the carrier substrate 100 of silicon material. It is followed by a step of thinning 2' the monocrystalline substrate 20 of $SrTiO_3$ material after having been joined to the carrier substrate 100 of silicon material. FIG. 1 schematically shows the thinning step 2', which may be implemented, for example, by way of chemical and/or mechanical etching (polishing, grinding, milling, etc.). Thus, the monocrystalline seed layer 200 of $SrTiO_3$ material may be obtained, which will serve as the monocrystalline seed for a step of epitaxially growing 3' the crystalline layer 300 of PZT material on the substrate for epitaxial growth of a crystalline layer of PZT material 10 shown schematically in FIG. 1. Those skilled in the art would be capable of adjusting the parameters used for epitaxially growing a crystalline layer of PZT material usually used in homoepitaxy or heteroepitaxy on a bulk crystalline substrate in order to optimize the step of epitaxially growing 3' the crystalline layer 300 of PZT material on the substrate for epitaxial growth of a crystalline layer of PZT material 10 of the present disclosure. One possibility is that the epitaxial growth of the PZT material takes place by way of cathode sputtering, for example, magnetron cathode sputtering, known to those skilled in the art. Other possibilities would be either the application of a sol-gel process including deposition at low temperature followed by various anneals at temperatures of between 350° C. and 650° C. or even 700° C., or epitaxial growth by way of MOCVD at typical temperatures of about 550° C. using precursors known to those skilled in the art. The presence of the monocrystalline seed layer makes it possible to favorably influence the crystal quality of the crystalline layer of PZT material. In particular, it is possible to obtain a monocrystalline layer of PZT material. Incidentally, the present disclosure is not limited to epitaxy of the PZT material but extends to certain piezoelectric crystals of perovskite type such as PMN-PT or PZN-PT having a lattice parameter close to that of the PZT material.

It should be noted that the thermal expansion coefficient of the carrier substrate 100 dominates the thermal behavior of the substrate for epitaxial growth of a crystalline layer of PZT material 10 during the step of epitaxially growing 3' the crystalline layer 300 of PZT material. This is due to the low thickness, preferably less than 1 μm, of the monocrystalline seed layer 200 of $SrTiO_3$ material relative to the total thickness of the substrate for epitaxial growth of a crystalline layer of PZT material 10, which is of the order of several tens to hundreds of μm. Incidentally, the $SrTiO_3$ material is chosen so as to provide a monocrystalline seed layer having a lattice parameter that is as close as possible to the lattice parameter chosen for the crystalline layer 300 of PZT material, preferably the lattice parameter in the relaxed state in order to allow epitaxial growth resulting in as few defects as possible in the crystalline layer 300 of PZT material. Incidentally, the material of the carrier substrate 100 advantageously has a thermal expansion coefficient, which is particularly close to the thermal expansion coefficient of the PZT material for the same reasons of decreasing defects in the crystalline layer 300 obtained by epitaxy. Preferably, a carrier substrate 100 of sapphire material would therefore be used for the present disclosure.

Figure 2:
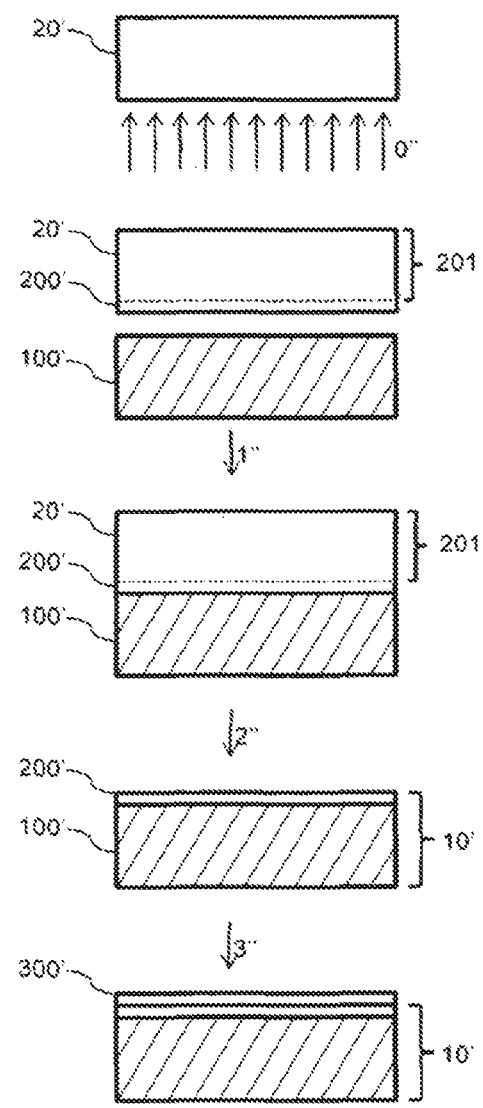
FIG. 2 illustrates a process for producing a crystalline layer of PZT material according to another embodiment of the present disclosure and a substrate for the epitaxial growth of such a crystalline layer of PZT material according to this other embodiment of the present disclosure.

FIG. 2 schematically shows one embodiment of the process for producing a crystalline layer of PZT material, which differs from the embodiment described in conjunction with FIG. 1 in that the monocrystalline substrate 20' of $SrTiO_3$ material undergoes a step of implanting 0" atomic and/or ionic species in order to form a weakened zone delimiting a portion 200' of the monocrystalline substrate 20' of $SrTiO_3$ material intended to be transferred to the carrier substrate 100' of silicon material, and in that the thinning step 2" comprises detaching at this weakened zone so as to transfer the portion 200' of the monocrystalline substrate 20' of SrTiO$_3$ material to the carrier substrate 100' of silicon material, in particular, this detaching comprises the application of a thermal and/or mechanical stress. The advantage of this embodiment is thus to be able to recover the remaining part 201 of the starting monocrystalline substrate 20' of SrTiO$_3$ material, which may thus be used again to undergo the same process again and thus decrease costs. The substrate for epitaxial growth of a crystalline layer of PZT material 10' thus illustrated in FIG. 2 is used for the step of growing 3" the crystalline layer 300' of PZT material as already described in the process described in conjunction with FIG. 1. In general, the implantation step 0" takes place using hydrogen ions. One advantageous alternative well known to those skilled in the art consists in replacing all or some of the hydrogen ions with helium ions. A hydrogen implantation dose will typically be between $6\chi10^{16}$ cm$^{-2}$ and $1\times10^{17}$ cm$^{-2}$. The implantation energy will typically be between 50 to 170 keV. Thus, the detaching typically takes place at temperatures of between 300 and 600° C. Thicknesses of the monocrystalline seed layer of the order of 200 nm to 1.5 μm are thus obtained. Immediately after the detaching operation, additional technological steps are advantageously added with the aim of either strengthening the bonding interface or of restoring a good level of roughness, or of correcting any defects, which may have been be generated in the implantation step or else to prepare the surface of the seed layer for the resumption of epitaxy. These steps are, for example, polishing, (wet or dry) chemical etching, annealing, chemical cleaning. They may be used alone or in a combination, which those skilled in the art will be capable of adjusting.

FIG. 3 differs from the embodiments described in conjunction with FIG. 1 and FIG. 2 in that the substrate for epitaxial growth of a crystalline layer of PZT material (10, 10') comprises a detachable interface 40' that is configured to be detached. In the case of a carrier substrate 100 of silicon material, it may be a rough surface, for example, of silicon material, joined with the monocrystalline seed layer during the joining step. Else, a rough interface may be present within the carrier substrate 100 of silicon material, the latter, for example, obtained by joining two silicon wafers. Another embodiment would be to introduce, at the face to be joined with the monocrystalline seed layer, a porous silicon layer that is liable to split during the application of a mechanical and/or thermal stress, for example, by inserting a blade at the edge of the wafer known to those skilled in the art or by applying an anneal. Obviously, this interface is chosen so as to withstand the other mechanical and/or thermal stresses experienced during the process of the present disclosure (e.g., detaching, epitaxial growth, etc.). In the case of a carrier substrate of sapphire material, it may be a stack of silicon oxide, silicon nitride and silicon oxide (what is called an ONO-type structure) produced on the face of the sapphire to be joined with the monocrystalline seed layer. Such a stack is liable to undergo detachment at the silicon nitride layer when applying a laser that passes through the sapphire carrier substrate (detaching or debonding of the "laser lift-off" type). Those skilled in the art will be capable of identifying other processes for producing this detachable interface. These various detaching configurations thus make it possible either to transfer the epitaxial layer to a final carrier, which is not compatible with the growth parameters or to prepare a thick film of PZT material of freestanding type.

FIG. 4 schematically shows one embodiment of the process for producing a crystalline layer of PZT material, which differs from the embodiments described in conjunction with FIGS. 1-3, wherein the monocrystalline seed layer 2000' of SrTiO$_3$ material is in the form of a plurality of tiles (2001', 2002', 2003') each transferred to the carrier substrate 100" of silicon material. The various tiles may take any shape (square, hexagonal, strips, etc.) and have different sizes varying from a few mm$^2$ to several cm$^2$. The spacing between the chips may also vary significantly depending on whether what is sought is a maximum density of coverage (in this case a spacing of less than 0.2 mm will preferably be chosen) or conversely a maximum spread of the tiles within the substrate (in this case the spacing may be several millimeters and even centimeters). For each tile, a person skilled in the art would be capable of applying their desired transfer and they are not limited to a particular process. Thus, it is possible to envisage applying the technical teachings described in conjunction with the process illustrated schematically in FIG. 1 or the technical teachings described in conjunction with the process illustrated schematically in FIG. 2, or even a combination of the two. Thus, it is possible to join 1' monocrystalline substrates (2001, 2002, 2003) of SrTiO$_3$ material, which have a size smaller than the size of the carrier substrate 100" in order to create by thinning 2''' on this latter the monocrystalline seed layers (2001', 2002', 2003') for the epitaxial growth 3''' of a crystalline layer (3001, 3002, 3003) of PZT material on each tile of the substrate for epitaxial growth of a crystalline layer of PZT material 10".

The various embodiments described in conjunction with FIGS. 1 to 4 thus open up the possibility of co-integration of components made in the crystalline layer of PZT material with components made in the carrier substrate of silicon material. This latter may simply be a silicon substrate, but it may also be an SOI-type substrate comprising a silicon oxide layer separating a silicon substrate from a thin silicon layer. In the case of the embodiments described in conjunction with FIGS. 1 to 4, access to the carrier substrate may be achieved simply by way of lithography and etching known to those skilled in the art. In the case of the embodiment described in conjunction with FIG. 4, it is also possible just to choose the locations of the tiles and their spacing.

FIG. 5 schematically shows one embodiment, which differs from the embodiment described in conjunction with FIG. 4 in that the carrier substrate 100" and subsequently the substrate for epitaxial growth of a crystalline layer of PZT material 10" comprises a detachable interface 40 that is configured to be detached, for example, by means of a laser debonding (laser lift-off) technique and/or chemical attack and/or by means of mechanical stress. This would allow part of the carrier substrate 100" to be removed as already mentioned in conjunction with FIG. 3. One example would be the use of a carrier substrate 100 of SOI type comprising a silicon oxide layer separating a silicon substrate from a thin silicon layer. This oxide layer could be used as a detachable interface 40 by selective etching this oxide layer, for example, by immersion in a hydrofluoric (HF) acid bath. This option of detaching a buried layer by means of chemical etch is particularly advantageous when it is in combination with treating a plurality of small substrates. Specifically, the range of under-etches is generally limited to a few centimeters or even a few millimeters if it is desired to retain industrially reasonable treatment conditions and times. Treating a plurality of small substrates allows the initiation of several chemical etching fronts by virtue of possible access to the buried layer between each tile, rather than just at the extreme edges of the substrates, which may be up to 300 mm in diameter. In the case of an SOI-type carrier substrate, it is thus possible to partially remove the thin layer of silicon between the tiles in order to allow the initiation of several etching fronts.

Since the thin layer of silicon has a predetermined thickness (which may vary between 5 nm to 600 nm, or even thicker depending on the intended application), it could thus be used to form microelectronic components and thus allow the co-integration of components based on PZT materials in a single substrate.

Thus, after having formed the crystalline layer (3001, 3002, 3003) by epitaxy, it is also possible to conceive joining this structure to a final substrate and detaching, at the detachable interface 40, a part of the carrier substrate 100". The final substrate may thus provide additional functionalities, which are, for example, incompatible with parameters of the growth carried out previously (for example, final substrate of flexible plastic type or final substrate comprising metal lines). Additionally and in general, the detachable interface is not necessarily located inside the carrier substrate but may also be located at the interface with the seed layer of SrTiO$_3$ material joined to this carrier substrate (for example, a stack of a layer of silicon nitride between two layers of silicon oxide allows laser debonding, particularly suitable for a carrier substrate of sapphire type) as already described in conjunction with FIG. 3.

What is claimed is:

1. A process for producing a plurality of crystalline layers of PZT material, comprising:
    transferring a plurality of tiles to a carrier substrate comprising a substantially planar main surface, each tile of the plurality of tiles comprising a monocrystalline seed layer of SrTiO$_3$; and
    epitaxially growing the plurality of crystalline layers of PZT material on the plurality of tiles,
        wherein each crystalline layer of PZT material of the plurality of crystalline layers of PZT material is disposed on a respective tile of the plurality of tiles,
    wherein the carrier substrate further comprises a detachable interface buried within the carrier substrate, the detachable interface configured to be detached by a laser debonding technique, chemical attack, and/or by means of mechanical stress.

2. The process of claim 1, wherein transferring the plurality of tiles to the carrier substrate comprises joining a plurality of monocrystalline substrates of SrTiO3 material to the substantially planar main surface of the carrier substrate and thinning the plurality of monocrystalline substrates of SrTiO$_3$ material to form the plurality of tiles on the carrier substrate.

3. The process of claim 2, comprising joining the plurality of monocrystalline substrates of SrTiO$_3$ material to the substantially planar main surface of the carrier substrate by molecular adhesion of the plurality of monocrystalline substrates of SrTiO$_3$ material to the substantially planar main surface of the carrier substrate.

4. The process of claim 2, wherein thinning the plurality of monocrystalline substrates of SrTiO$_3$ material comprises:
    forming a weakened zone in each monocrystalline substrate of SrTiO$_3$ material of the plurality of monocrystalline substrates of SrTiO$_3$ material delimiting a portion of each monocrystalline substrate SrTiO3 material to be transferred to the carrier substrate; and
    detaching each monocrystalline substrate of SrTiO$_3$ material of the plurality of monocrystalline substrates of SrTiO$_3$ material at the weakened zone to transfer the portion of each monocrystalline substrate of SrTiO$_3$ material to the carrier substrate.

5. The process of claim 4, wherein forming the weakened zone comprises implanting atomic and/or ionic species into each monocrystalline substrate of SrTiO$_3$ material of the plurality of monocrystalline substrates of SrTiO$_3$ material.

6. The process of claim 1, wherein epitaxially growing the plurality of crystalline layers of PZT material comprises forming each crystalline layer of PZT of the plurality of crystalline layers of PZT material spaced apart from an additional crystalline layer of PZT of the plurality of crystalline layers of PZT material formed on an additional tile of the plurality of tiles.

7. The process of claim 1, wherein the plurality of crystalline layers of PZT material are monocrystalline.

8. The process of claim 1, wherein the carrier substrate further comprises a detachable interface buried within the carrier substrate, the detachable interface configured to be detached by a laser debonding technique, chemical attack, and/or by means of mechanical stress.

9. The process of claim 1, wherein the carrier substrate comprises a silicon-on-insulator substrate comprising a silicon oxide layer between a silicon substrate and a silicon layer, and transferring the plurality of tiles to the carrier substrate comprises transferring the plurality of tiles to the silicon layer of the carrier substrate.

10. The process of claim 9, further comprising detaching the silicon layer comprising the plurality of tiles and the plurality of crystalline layers of PZT material thereon from the silicon-on-insulator substrate.

11. A substrate, comprising:
    a carrier substrate comprising a substantially planar main surface;
    a plurality of tiles on the substantially planar main surface of the carrier substrate, each tile of the plurality of tiles comprising a monocrystalline seed layer of SrTiO$_3$; and
    a plurality of crystalline layers of PZT material, wherein each crystalline layer of PZT material of the plurality of crystalline layers of PZT material is disposed on a respective tile of the plurality of tiles,
    wherein the carrier substrate further comprises a detachable interface buried within the carrier substrate, the detachable interface configured to be detached by a laser debonding technique, chemical attack, and/or by means of mechanical stress.

12. The substrate of claim 11, wherein each tile of the plurality of tiles is spaced apart from an additional tile of the plurality of tiles.

13. The substrate of claim 11, wherein each crystalline layer of PZT material of the plurality of crystalline layers of PZT material is spaced apart from an additional crystalline layer of PZT material of the plurality of crystalline layers of PZT material.

14. The substrate of claim 11, wherein the carrier substrate comprises a silicon-on-insulator substrate comprising a silicon oxide layer between a silicon substrate and a silicon layer, the detachable interface defined by the silicon oxide layer.

15. The substrate of claim 11, wherein the carrier substrate comprises two silicon wafers joined together.

16. The substrate of claim 11, wherein the plurality of tiles on the carrier substrate each have a thickness of less than 10 µm.

17. The substrate of claim 11, wherein the plurality of tiles on the carrier substrate each have a thickness of less than 1 µm.

18. The substrate of claim 11, wherein the carrier substrate comprises silicon material, sapphire material, nickel material, or copper material.

19. A substrate, comprising:
- a carrier substrate comprising a substantially planar main surface;
- a plurality of tiles on the substantially planar main surface of the carrier substrate, each tile of the plurality of tiles comprising a monocrystalline seed layer of $SrTiO_3$; and
- a plurality of crystalline layers of PZT material, wherein each crystalline layer of PZT material of the plurality of crystalline layers of PZT material is disposed on a respective tile of the plurality of tiles,
- wherein at least one tile of the plurality of tiles exhibits a different size than at least one other tile of the plurality of tiles.

* * * * *